United States Patent [19]

Ito

[11] Patent Number: 4,620,263
[45] Date of Patent: Oct. 28, 1986

[54] CONTAINER FOR ACCOMMODATING A CONTROL DEVICE

[75] Inventor: Eizi Ito, Komaki, Japan

[73] Assignee: Mitsubishi Denki Kabushiki Kaisha, Tokyo, Japan

[21] Appl. No.: 596,822

[22] Filed: Apr. 3, 1984

[30] Foreign Application Priority Data

Apr. 8, 1983 [JP] Japan .............................. 58-52189[U]

[51] Int. Cl.⁴ ............................................. H05K 7/20
[52] U.S. Cl. .................................... 361/383; 361/384; 361/395
[58] Field of Search .......................... 165/80 B, 80 D; 174/15 R, 16 R; 361/383, 384, 386, 388, 389, 395, 399

[56] References Cited

U.S. PATENT DOCUMENTS 3,407,869 10/1968 Staunton ............................ 361/383
4,489,363 12/1984 Goldberg ........................... 361/383

Primary Examiner—A. D. Pellinen
Assistant Examiner—Greg Thompson
Attorney, Agent, or Firm—Wenderoth, Lind & Ponack

[57] ABSTRACT

A control device which contains parts that generate heat which comprises a box made of an aluminum die cast having radiator fins, and a cover plate that covers the open portion of the box. Cut-away portions are formed in the top surface and in the bottom surface of the box, and covers with or without windows are fitted to the cut-away portions, to permit construction of the control device in either a completely sealed form or shielded form housing.

11 Claims, 6 Drawing Figures

CONTAINER FOR ACCOMMODATING A CONTROL DEVICE

BACKGROUND OF THE INVENTION

This invention relates to a container for accommodating a small control device such as an inverter device, and particularly to the construction for radiating heat generated in the box for the protection thereof. The following description will deal with the case of an inverter device. In an inverter device, in general, large amounts of heat are generated by diodes and a transistor module which form a main circuit among other electric circuit parts constituting the inverter device. In an inverter device of small capacity, the box is die cast from an aluminum alloy, and the generated heat is emitted from radiator fins and the surfaces of the box, so that the diodes and transistor elements will work properly and that the electronic parts for a control circuit mounted on a printed wiring board will not be affected by the temperature, in order to maintain improved reliability.

FIGS. 1 and 2 show a conventional container for accommodating an inverter device of the completely sealed type, wherein reference numeral 1 denotes an inverter device of the completely sealed type, and reference numeral 2 denotes a box which is a die cast of an aluminum alloy and which constitutes a container for the inverter device 1. Radiator fins 2a are provided on the back surface of the box and a cooling fan 3 is mounted on the lower side thereof. Electric parts 4 for a main circuit such as diodes and a transistor module are mounted on the side of the front surface of the box 2 in an intimately adhered manner, and a printed wiring board 5 on which are mounted electronic parts for a control circuit is detachably mounted on the box 2. Reference numeral 6 denotes a cover plate made of a plastic material which will be secured to the box by screws 7 to completely seal the inverter device which is assembled and wired in the box 2.

The conventional container has been constructed as mentioned above. Described below is the function of the container. When the inverter device 1 is in operation, electric parts 4 for a main circuit generate heat that is transmitted through contact surface of the box 2 to raise the temperature of the radiator fins 2a. Here, the cooling fan 3 is rotating to upwardly blow air through the radiator fins 2a. Therefore, the heat in the radiator fins is dissipated, and the diodes and transistor elements are allowed to operate at temperatures lower than a specified temperature. Further, the air temperature rises in a portion surrounded by the box 2 and the cover plate 6 due to the heat generated by the electric parts 4 for the main circuit and by the parts on a printed wiring board 5. The volume and the outer size of the inverter device, however, have been so determined so that the heat radiates from the side surfaces of the box and from the cover surface at a rate whereby the air temperature therein is maintained at a value lower than a temperature specified for the electronic parts.

The conventional container for accommodating the inverter device of the completely sealed type is constructed as described above. To keep the electronic parts from being affected by the air temperature, therefore, it is a tendency to increase the outer size of the device. Further, even in a place where a good environment is present and the device need not be completely sealed or protected, the device of the completely sealed type having a larger outer size must be used because to produce products of the same type in a shielded construction for which air tightness is not required as strictly as for the devices of the completely sealed type, it is necessary to employ a different plastic cover plate for the box made of die cast aluminum. For this purpose, however, an expensive metal mold is required, resulting in increased manufacturing costs.

SUMMARY OF THE INVENTION

An object of this invention is to eliminate the above-mentioned defects inherent in the conventional art. The invention comprises a container for accommodating a control mechanism such as an inverter device, having a housing provided with an opening and a molded plastic cover plate covering the opening, wherein cut-away portions are formed in the top surface and in the bottom surface of a box (housing) made of die cast aluminum, and covers for either completely sealing or shielding without sealing the control device, of a shape adapted to the cut-away portions of the housing are selectively fitted to the cut-away portions, thereby to permit the same cover plate to be used irrespective of whether the device must be completely sealed or not.

DESCRIPTION OF THE PREFERRED EMBODIMENT

Figure 1:
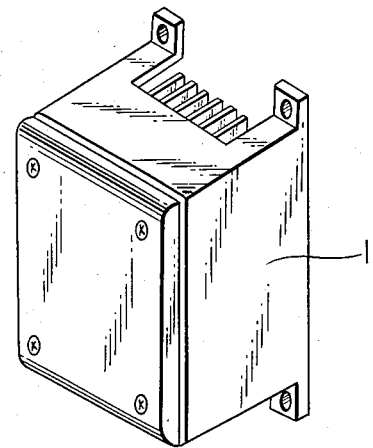
FIG. 1 is a perspective view of a conventional container for accommodating an inverter device.
Figure 2:
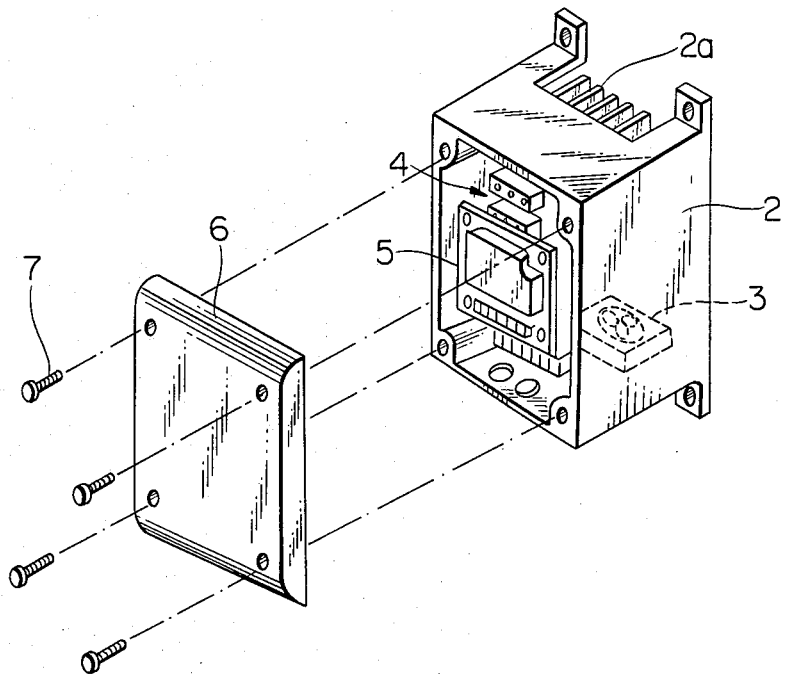
FIG. 2 is a perspective exploded view showing the conventional container of FIG. 1.
Figure 3:
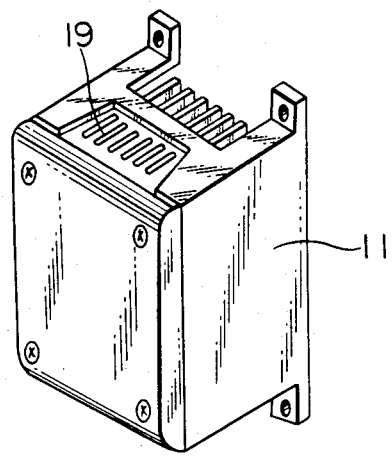
FIG. 3 is a perspective view which illustrates an embodiment of this invention.
Figure 6:
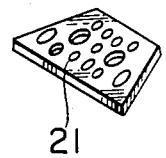
FIG. 6 is a perspective view of a bottom shielding plate in accordance with the invention.

An embodiment of the invention will be described below with reference to FIGS. 3 and 4, in which reference numeral 11 denotes an inverter device of the completely sealed type, and reference numeral 12 denotes a box (housing) die cast of an aluminum alloy and which, together with covers 18 and 20 and cover plate 6 constitutes a container for the inverter device 11. Radiator fins 12a are provided on the back surface of the box 12, and a cooling fan 3 is mounted on the lower side thereof. Cut-away portions 12c and 12d are formed in the top surface and the bottom surface of an outer wall 12b of the box 12 in trapezoidal shapes with obliquely angled inner corners. A control mechanism, including electric parts 4 for a main circuit such as diodes and a transistor module are intimately attached to the box-shaped bottom surface on the side of the front surface of the box 12. The control mechanism also includes a printed wiring board 5 on which are mounted electronic parts for a control circuit, detachably attached to the box 12. Reference numeral 6 denotes a cover plate made of a plastic material which completely seals or covers an opening in a side surface of box 12. The control mechanism is assembled and wired in the box through the opening before the cover 6 is fastened to the box 12 by screws 7. When the device is of the completely sealed type, a trapezoidally shaped cover 18 made of a thin metal plate such as an aluminum plate which radiates heat well, is attached to the cut-away portion 12c on the upper side of the box 12. When the device is of the shielded type, a top cover 19 (See FIG. 5) of an aluminum plate having windows is attached to the cut-away portion 12c. When the device is of the completely sealed type, a cover 20 of an aluminum plate having wiring holes is attached to the cut-away portion 12d on the lower side of the box 12. The wiring holes can, of course, be sealed when the wires pass therethrough. When the device is of the shielded type, a bottom cover 21 (See FIG. 6) of an aluminum plate having wiring holes and windows is attached to the cut-away portion 12d.

Figure 4:
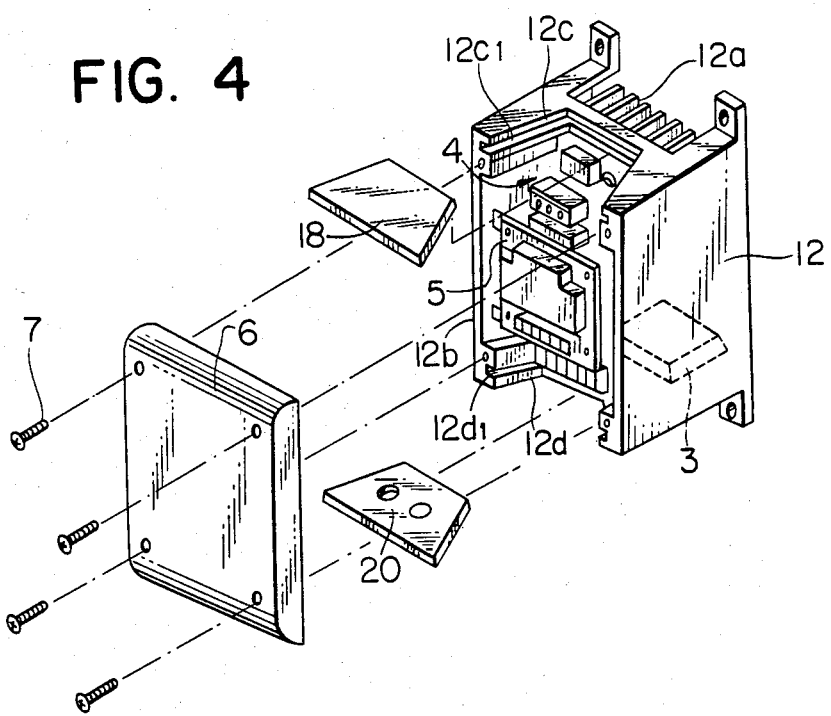
FIG. 4 is a perspective exploded view which illustrates the embodiment of FIG. 3.
Figure 5:
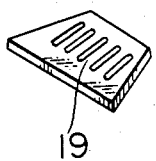
FIG. 5 is a perspective view of a top shielding cover in accordance with the invention.

As shown in FIG. 4, the cut-away portions 12c, 12d are formed in a trapezoidal shape and have grooves $12c_1$, $12d_1$ that run along the peripheries thereof. The grooves $12c_1$, $12d_1$ have nearly the same shape as the trapezoidally shaped covers 18, 19, 20, 21, and come into intimate contact with the covers 18, 20 when the covers 18, 20 are fitted therein to maintain a desired air tightness. After the covers 18, 20 are fitted into the grooves $12c_1$, $12d_1$, the cover plate 6 is fastened by screws 7. The cover plate 6 therefore pushes the front ends of the covers 18, 20 so that their peripheral portions are pushed to come into intimate contact with the grooves $12c_1$, $12d_1$.

The container for accommodating the inverter according to the embodiment of the invention is constructed as described above. The function will now be described below.

When the inverter device 11 is in operation, the electric parts 4 for the main circuit of the control mechanism generate heat that is transmitted from the contact surface of the box 12 to raise the temperature of the radiator fins 12a. Here, the cooling fan 3 is rotating to upwardly blow air through the radiator fins 12a. Therefore, the radiator fins 12a dissipate heat, and the diodes and transistor elements are allowed to operate at temperatures lower than a specified temperature. Further, the air temperature rises in a portion surrounded by the box 12 and the cover plate 6 due to the heat generated by the electric parts 4 and by the parts on the printed wiring board 5. The volume of the device, however, has been so determined that the heat radiates from the outer walls 12b of the box 12, from the plastic cover plate 6, and from the covers 18, 20 fitted to the cut-away portions on the top and bottom sides of the box, at a rate so as to maintain their temperature in the box 12 at a value lower than a temperature specified for the electronic parts.

When the device is to be used in an environment where the device must be completely sealed, if the covers 18, 20 are attached to the upper and lower portions, the internal air temperature becomes higher toward the upper side of the box 12 due to convection. By using the upper cover 18 having a larger surface area, therefore, the heat-radiating effect can be increased, the internal air temperature can be decreased, and the outer size of the device can be reduced. In a place where the environment is favorable, the device needs not be completely sealed but may simply be shielded. The device of the shielded type can be constructed by attaching the cover having windows to the type cut-away portion 12c on the top of the box and attaching the cover 21 having windows and wiring holes to the cut-away portion 12d on the bottom of the box. The internal air which is heated rises due to convection, and goes out of windows of the cover 19, and the external air enters through windows of the lower cover 21. Namely, the internal air circulates to maintain the temperature of the internal air low. The same cover 6 may be utilized in either construction.

Although the above-mentioned embodiment has dealt with an inverter device, it should be noted that the invention is not limited to the inverter device only but can also be adapted to general control devices of small capacities employing semiconductor parts.

Products composed of molded articles such as of die cast aluminum and plastic materials, are traditionally manufactured by using a metal mold which is expensive to construct. When the products are to be produced in series, the assignment remains in regard to how to reduce the number of types of parts and how to increase the types of the products. According to this invention, cut-away portions are formed in the top surface and in the bottom surface of the box made of die cast aluminum, and covers with or without windows are attached thereto, to construct the control devices of either the completely sealed type or the shielded type. Accordingly, there can be provided a wide variety of products at reduced costs.

What is claimed is:

1. A control device, comprising:
   a control mechanism which rises in temperature during use; and
   a container including:
   a die cast aluminum housing having radiator fins, said housing containing said control mechanism therein, said housing having a side surface having an opening therein for obtaining access therethrough to the interior thereof, and opposite top and bottom surfaces, said top and bottom surfaces respectively having top and bottom cut-away portions,
   a cover plate covering said opening mounted to said housing over said opening, said housing and cover plate forming means for sealing the interior of said housing except through said cut-away portions, and
   top and bottom protective covers attached to said housing respectively covering said top and bottom cut-away portions.

2. A control device as in claim 1, wherein said cover plate is formed of molded plastic.

3. A control device as in claim 1, wherein said covers have windows therein permitting cooling air flow therethrough.

4. A control device as in claim 1, wherein said top and bottom protective covers respectively comprise thin separate top and bottom heat radiating metal plates respectively fitted in grooves formed in said top and bottom cut-away portions.

5. A control device as in claim 1, wherein said top cover comprises a thin metal heat radiating top plate sealingly mounted to said top cut-away portion so as to prevent gas flow therethrough, said bottom cover comprising a thin metal heat radiating bottom plate mounted to said bottom cut-away portion so as to prevent gas flow therethrough, and having holes therein for receiving electrical wires therethrough for connection to said control mechanism.

6. A control device as in claim 5, wherein said control mechanism comprises a temperature sensitive electronic control circuit.

7. A control device as in claim 5, wherein said top and bottom plates are fitted in grooves formed in said top and bottom cut-out portions.

8. A control device as in claim 1, wherein said control mechanism comprises a temperature sensitive electronic control circuit.

9. A control device as in claim 5, wherein said cover plate is formed of molded plastic.

10. A control device as in claim 4, wherein said cutaway portions and top and bottom plates are trapezoidally shaped and have inner obliquely angled corners.

11. A control device as in claim 7, wherein said cutaway portions and top and bottom plates are trapezoidally shaped and have inner obliquely angled corners.

* * * * *